United States Patent [19]

Ichihashi

[11] Patent Number: 5,852,320

[45] Date of Patent: Dec. 22, 1998

[54] SEMICONDUCTOR SENSOR WITH PROTECTIVE CAP COVERING EXPOSED CONDUCTIVE THROUGH-HOLES

[75] Inventor: Motomi Ichihashi, Tokyo, Japan

[73] Assignee: Mitsubishi Denki Kabushiki Kaisha, Tokyo, Japan

[21] Appl. No.: 698,321

[22] Filed: Aug. 15, 1996

[30] Foreign Application Priority Data

Feb. 19, 1996 [JP] Japan ................................ 8-030842

[51] Int. Cl.$^6$ .......................... H01L 29/82; H01L 23/02; H01L 23/04
[52] U.S. Cl. .......................... 257/419; 257/417; 257/686; 257/698
[58] Field of Search ..................... 257/415, 418, 257/419, 686, 698, 700, 704, 711, 417

[56] References Cited

U.S. PATENT DOCUMENTS

| | | | |
|---|---|---|---|
| 4,314,225 | 2/1982 | Tominaga et al. | 257/419 |
| 4,729,061 | 3/1988 | Brown . | |
| 4,787,250 | 11/1988 | Varrese . | |
| 4,802,952 | 2/1989 | Kobori et al. | 156/634 |
| 5,241,456 | 8/1993 | Marcinkiewicz et al. | 257/686 |
| 5,291,062 | 3/1994 | Higgins, III | 257/698 |
| 5,397,917 | 3/1995 | Ommen et al. | 257/700 |
| 5,404,044 | 4/1995 | Booth et al. | 257/686 |
| 5,424,249 | 6/1995 | Ishibashi . | |
| 5,436,491 | 7/1995 | Hase et al. | 257/419 |
| 5,463,250 | 10/1995 | Nguyen et al. | 257/698 |
| 5,467,253 | 11/1995 | Heckman et al. | 257/698 |
| 5,490,324 | 2/1996 | Newman | 257/686 |
| 5,513,407 | 5/1996 | Reinert, Sr. | 8/158 |
| 5,567,972 | 10/1996 | Abe | 257/704 |

FOREIGN PATENT DOCUMENTS

| | | |
|---|---|---|
| 59-134034 | 7/1984 | Japan . |
| 371030 | 3/1991 | Japan . |
| 5-235377 | 9/1993 | Japan . |
| 727639 | 1/1995 | Japan . |

OTHER PUBLICATIONS

Webster's II Dictionary p. 1256, 1984.

Primary Examiner—Stephen Meier

[57] ABSTRACT

A semiconductor sensor comprising a substrate having thick-film conductors formed on both sides of the substrate, a semiconductor sensor chip having a diaphragm to which a pressure to be detected is applied and a pan-shaped cap bonded to the mounting side of the substrate with a die bond agent, further comprises plural through-holes pierced through the substrate, conductors formed in plural through-holes which connect the thick-film conductors to each other, bonding electrodes formed from a thick-film conductor on the mounting side of the substrate, each being connected to the thick-film conductor of the mounting side of the substrate and to the semiconductor sensor chip by a wire bonding, and a protection glass film formed on the thick-film conductor of the mounting side having apertures for forming exposed conductor portions of the thick-film conductor, wherein the opening of each through-hole and the exposed conductor portions are disposed at the position to which the cap is bonded and covered by the die bond agent for bonding the cap.

11 Claims, 6 Drawing Sheets

SEMICONDUCTOR SENSOR WITH PROTECTIVE CAP COVERING EXPOSED CONDUCTIVE THROUGH-HOLES

BACKGROUND OF THE INVENTION

1. Field of the Invention

The present invention relates to a semiconductor sensor comprising a semiconductor sensor chip with or without a pedestal mounted on ceramic or other type of substrate, and relates particularly to a semiconductor pressure sensor comprising a pressure sensor chip with or without a pedestal.

Figure 7:
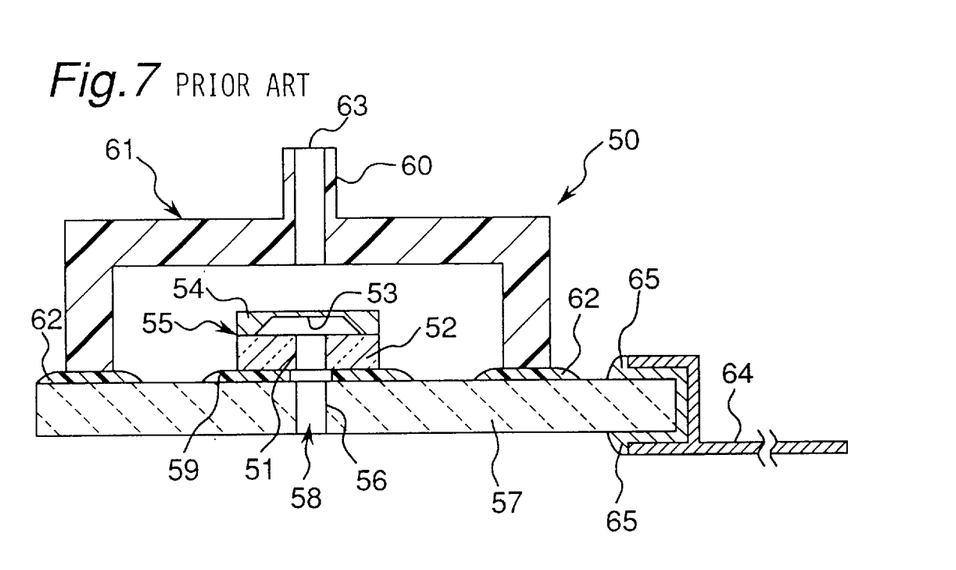
FIG. 7 is a cross section diagram of conventional semiconductor pressure sensor.

2. Description of the Prior Art FIG. 7 is a cross section diagram of a semiconductor pressure sensor according to the prior art. As shown in FIG. 7, the sensor unit 55 comprises a pressure sensor chip 54 having a thin-walled diaphragm 53 in the center thereof bonded to a large rectangular plate glass pedestal 52, which comprises in approximately the center thereof a through-hole 51 for pressure conveyance. The ceramic substrate 57 of the semiconductor pressure sensor 50 similarly comprises in approximately the center thereof a through-hole 56 for pressure conveyance. The sensor unit 55 is then bonded to the ceramic substrate 57 using a die bond agent 59 with the two through-holes 51 and 56 aligned to form a single pressure conveyance hole 58.

To protect the pressure sensor chip 54 and the thick film formed on the ceramic substrate 57, a resin cap 61 is bonded to the mounting surface of the ceramic substrate 57. Note that the mounting surface as used herein is the surface side of the ceramic substrate 57 on which the thick film, sensor unit 55, and other components are mounted. As also shown in FIG. 7, the cap 61 forms a large pan-shaped housing with a projection 60 providing a pressure conveyance opening formed on the outside surface side of the pan bottom (shown at the top in FIG. 7). This pressure conveyance opening in the cap 61 comprises a through-hole used as a pressure conveyance hole 63. The diaphragm 53 of the pressure sensor chip 54 is thus exposed to pressure introduced through these pressure conveyance holes 63 and 58. Lead terminals 64 are also bonded with solder 65 to the corresponding thick-film conductors formed on both sides of the ceramic substrate 57 to complete the semiconductor pressure sensor 50.

Figure 8:
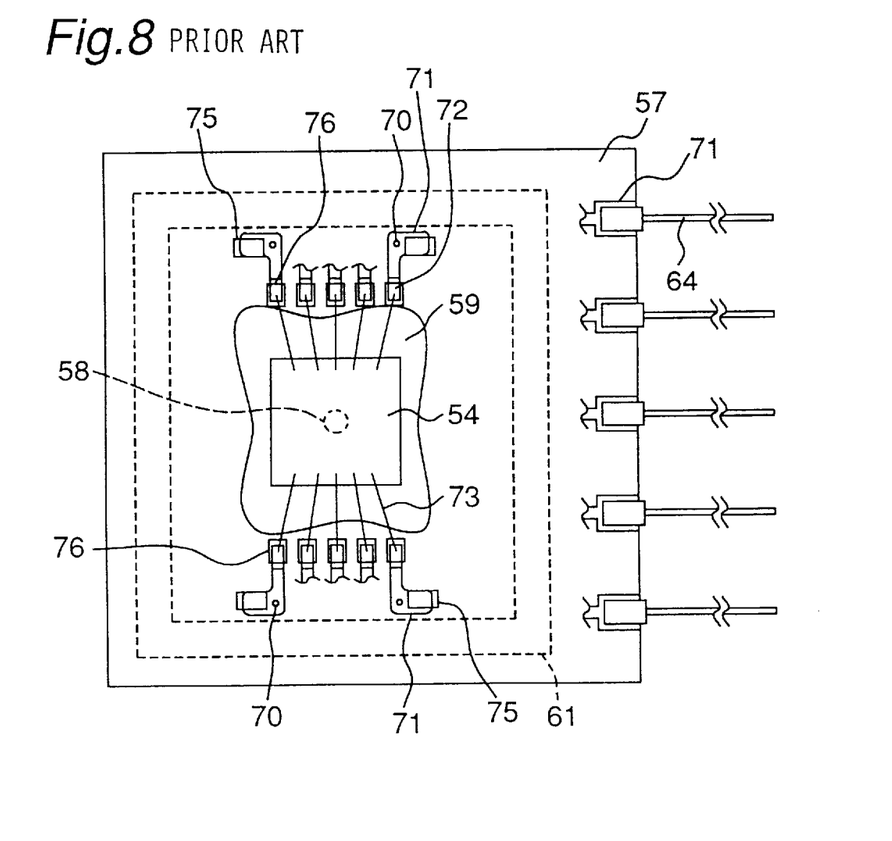
FIG. 8 is a plan view of a ceramic substrate according to the prior art whereby a semiconductor pressure sensor is formed from a thick-film hybrid IC using through-holes.

In a conventional thick-film hybrid IC, through-holes are commonly formed in the ceramic or other substrate to connect the wiring patterns on opposite sides of the substrate, and the semiconductor pressure sensor 50 shown in FIG. 7 can also be achieved in a thick-film hybrid IC with through-holes. FIG. 8 is a plan view of the semiconductor pressure sensor 50 shown in FIG. 7 before bonding the cap 61 in position.

As shown in FIG. 8, plural through-holes 70 are formed in the ceramic substrate 57. The wall of each through-hole 70 is lined with a conductor (not shown in the Figure), and a thick-film conductor 71 is formed to a specific wiring pattern on the mounting surface of the ceramic substrate 57. A thick-film conductor (not shown in the Figure) is similarly formed to a specific wiring pattern on the side opposite the mounting surface of the ceramic substrate 57 (the "non-mounting surface"). The thick-film conductor 71 is formed around the opening of each through-hole 70 formed on the mounting surface of the ceramic substrate 57. Plural bonding electrodes 72 are also formed on the mounting surface from a thick-film of gold (Au). Each bonding electrode 72 is also connected to the corresponding electrode (not shown in the Figure) of the pressure sensor chip 54 by means of a bonding wire 73.

Note that a thick-film conductor is also formed around the opening of each through-hole 70 on the non-mounting surface of the ceramic substrate 57. The conductor lining each through-hole 70 is connected to both the thick-film conductor 71 on the mounting surface and the thick-film conductor on the non-mounting surface of the ceramic substrate 57. The bonding electrodes 72 connected to the thick-film conductor 71 are also formed overlaying part of the corresponding thick-film conductor 71, and the bonding electrodes 72 are thus electrically connected to the corresponding thick-film conductor 71.

Note also that a protective glass film made from an insulated glass thick-film is also formed on both sides of the ceramic substrate 57 to protect the thick-films formed thereon.

In order to check the continuity between the mounting surface-side thick-film conductor 71 and the thick-film conductor formed on the non-mounting surface and connected through the through-holes 70 to the mounting surface-side thick-film conductor 71 when forming the protective glass film, plural openings 75 exposing a specific part of each mounting surface-side thick-film conductor 71 are formed such that the thick-film conductor is not covered by the protective glass film in each opening 75. Similar openings are formed to expose a specific part of the thick-film conductors on the non-mounting surface side.

Pressure introduced from the pressure conveyance hole 63 is also prevented from being released to the outside through the through-holes 70 by covering both ends of each through-hole 70 with a protective glass film. The plastic cap 61 is then bonded with an adhesive 62 to a specific position on the mounting surface of the ceramic substrate 57 in a manner covering the sensor unit 55, through-holes 70, thick-film conductors 71, bonding electrodes 72, and openings 75. Note that openings 76 are also provided on the bonding electrodes 72 to prevent formation of the protective glass film.

Migration between the openings 76 for the bonding electrodes 72 does not occur during the manufacturing process because the material (Au) used to form the bonding electrodes 72 does not cause migration. The openings formed in the thick-film conductors on the non-mounting surface can also be covered with resin or other material after the semiconductor pressure sensor 50 is finished. With this structure, however, not only does migration occur between the openings 75 formed in the mounting surface-side thick-film conductor 71, but the die bond agent 59 tends to flow over the bonding electrodes 72 when the sensor unit 55 is die bonded to the ceramic substrate 57 with the die bond agent 59, the adhesive 62 tends to flow over and contaminate the bonding electrodes 72 when the cap 61 is mounted to the ceramic substrate 57 with the adhesive 62, and poor connections thus occur due to contamination when bonding the bonding wires 73 to the bonding electrodes 72.

A further problem is that the die bond agent 59 flows into and blocks the pressure conveyance hole 58, thus preventing the pressure sensor chip 54 from detecting the pressure that should be introduced through the pressure conveyance hole 58.

The protective glass films covering the opening ends of the through-holes 70 are also fragile and easily broken. When the protective glass film breaks, the pressure introduced from the pressure conveyance hole 63 leaks out from the through-hole 70, thus preventing the pressure sensor chip 54 from accurately detecting the pressure introduced from the pressure conveyance hole 63.

SUMMARY OF THE INVENTION

An object of the present invention is therefore to provide a semiconductor sensor whereby defects in the manufacturing process can be reduced, and the reliability of a semiconductor pressure sensor formed on a thick-film hybrid IC using through-holes can be improved at low cost.

To achieve the aforementioned objects, a semiconductor sensor according to the present invention is a semiconductor sensor for detecting pressure from the displacement of a diaphragm when pressure is introduced. This semiconductor sensor of the present invention is formed from a thick-film hybrid IC comprising in the substrate thereof a through-hole for pressure conveyance and at least one other through-hole. On the mounting surface side of the thick-film hybrid IC a sensor unit, which comprises a pedestal with a pressure conveyance through-hole in approximately the center thereof bonded to a pressure sensor chip having a diaphragm formed in the center thereof, is bonded with a die bond agent such that the through-hole in the pedestal is aligned with the pressure conveyance through-hole of the substrate. A pan-shaped cap is then bonded by an adhesive to said mounting surface side to cover and protect the sensor unit.

This semiconductor sensor further comprises thick-film conductors connected to each other by conductors formed on walls of through-holes pierced through substrate and formed in a specific pattern on both sides of the substrate; bonding electrodes formed from a thick-film of a conductor connected to said thick-film conductor of the mounting side of the substrate, and connected to the semiconductor sensor chip by wire bonding, respectively; a protective glass film made from a thick-film of insulated glass forming a protective layer over the thick-film conductor to protect said thick-film conductor; and plural exposed conductors exposing said thick-film conductor by not forming the protective glass film thereon. Said semiconductor sensor is characterized by the through-holes and exposed conductors formed on the mounting surface side being disposed at the position to which the cap is bonded to the substrate, and the mounting surface side opening of the through-hole and the exposed conductors on the mounting surface side being covered by the adhesive agent.

The semiconductor sensor of the invention may further comprise a second dike formed as a wall of at least one thick-film layer between the sensor unit and bonding electrode to prevent the die bond agent from flowing over the bonding electrode. More specifically, said second dike is formed by a process overlaying a thick-film of insulated glass with a thick-film conductor, and forming the thick-film conductor with the protective glass film as a thick-film on the substrate.

Positioning marks indicating the position to which the cap is to be bonded to the substrate may also be formed on the mounting surface of the substrate from the thick-film conductor.

To prevent the die bond agent from flowing into the through-holes in the pedestal and the substrate in a semiconductor sensor for detecting pressure as described above, a first dike is formed as a wall of at least one thick-film layer encircling the outside circumference of the mounting surface-side opening of the through-hole formed on the substrate. More specifically, said first dike is formed by a process overlaying a thick-film of insulated glass with a thick-film of a conductor, and forming the thick-film conductor with the protective glass film as a thick-film on the substrate.

Because the through-holes and exposed conductors on the mounting surface side are disposed to the position at which the cap is bonded, the through-hole opening can be positively and durably closed, the sensor unit can be sealed, the exposed conductors can be positively covered, migration between the exposed conductors can be prevented, and reliability can be improved by bonding the cap to the predetermined position on the mounting surface side of the substrate.

Furthermore, the semiconductor sensor for detecting pressure can accurately detect the pressure by means of the semiconductor sensor chip because the pressure introduced to the sensor unit cannot leak out.

To thus positively close the through-hole openings and cover the exposed conductors on the mounting surface, the cap must be positively bonded to the precise bonding position. This can be accomplished easily and accurately by bonding the cap along the positioning marks.

Outflow of the die bond agent used to bond the sensor unit to the substrate mounting surface over the bonding electrodes can also be prevented by means of the second dike. It is therefore possible to prevent contamination of the bonding electrodes by the die bond agent, and poor contact between the electrodes and bonding wires resulting from electrode contamination can therefore be prevented.

It is also possible to prevent the die bond agent from flowing into the through-holes in the pedestal and substrate by means of the first dike. As a result, the pressure entering the sensor unit through the pressure conveyance through-holes can be accurately detected by the semiconductor sensor chip.

It is also not necessary to introduce a new production process to form the positioning marks and first and second dikes because these can be formed at the same time and in the same film formation process used to form the thick-film conductors and protective glass film on the substrate. As a result, the positioning marks and first and second dikes can be provided at low cost, requiring essentially only the nominal cost of materials.

It is therefore possible by means of the present invention to improve reliability and reduce defects in the manufacturing process at a nominal materials cost in a semiconductor sensor formed from a thick-film hybrid IC using through-holes.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying Figures.

Embodiment 1

Figure 1:
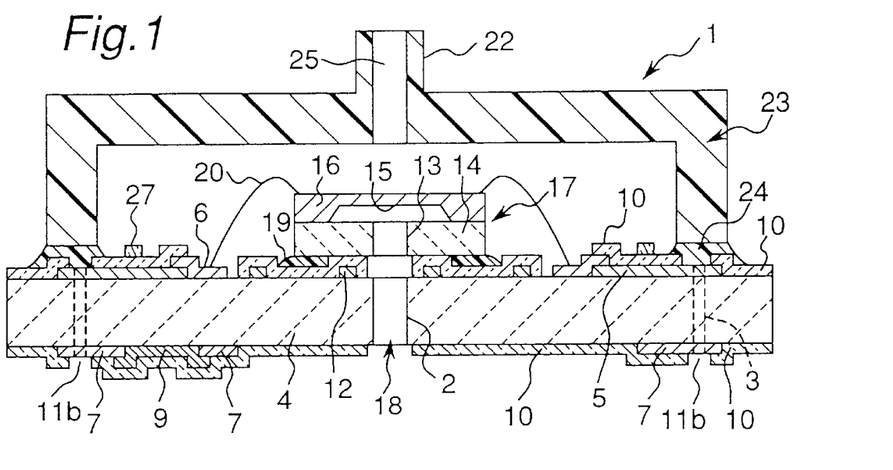
FIG. 1 is a cross section diagram of a semiconductor pressure sensor according to the preferred embodiment of the present invention.
Figure 2:
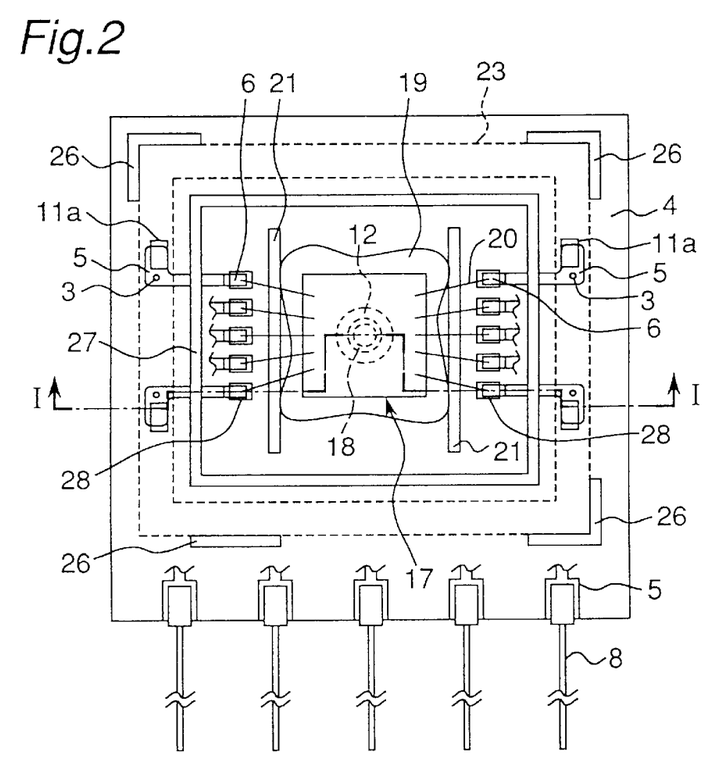
FIG. 2 is a plan view of the internal structure of the semiconductor pressure sensor shown in FIG. 1.

FIG. 1 is a cross section diagram of a semiconductor pressure sensor according to the preferred embodiment of the present invention, and FIG. 2 is a plan view of the internal structure of the semiconductor pressure sensor shown in FIG. 1 before the plastic cap is bonded in place. Note that FIG. 1 is a cross section through line I–I in FIG. 2, i.e., a cross section after the plastic cap is bonded in place.

The semiconductor pressure sensor 1 shown in FIGS. 1 and 2 is described below. First, a thick-film conductor 5 of, for example, alumina is formed to a specific wiring pattern on one side (the mounting surface as described above) of the ceramic substrate 4. The ceramic substrate 4 comprises in approximately the center thereof a pressure conveyance through-hole 2 and plural other through-holes 3. A conductor (not shown in the Figures) is formed on the wall of each through-hole 3, and each thick-film conductor 5 is formed connected to the conductor in the corresponding through-hole 3.

Bonding electrodes 6 of a Au thick-film are formed at specific positions on the mounting surface of ceramic substrate 4. Part of the Au thick-film of each bonding electrode 6 overlays the corresponding thick-film conductor 5, and is thus electrically connected to the thick-film conductor 5.

Circuitry (not shown in the Figures) comprising thick-film resistors, thick-film conductors, and other circuit elements is also formed on the other side (the non-mounting surface side) of the ceramic substrate 4. As around the through-hole openings on the mounting surface side of the ceramic substrate 4, a thick-film conductor 7 is formed on the non-mounting surface according to a known wiring pattern around the other end of each through-hole 3, and is electrically connected to the conductor on the wall of the corresponding through-hole 3. Lead terminals 8 for establishing an electrical connection with external components are soldered on opposing sides of the ceramic substrate 4 to the thick-film conductors 5 and 7 formed at corresponding positions on opposing sides of the ceramic substrate 4, and the thick-film conductors 5 and 7 are electrically connected by the lead terminals 8. Note that to simplify the FIGS. 1 and 2 and the description of the preferred embodiment, the wiring pattern of the thick-film conductor 5 to which the lead terminals 8 are connected is not shown, and only part of the thick-film conductor 5 is shown.

A protective glass film 10 made from a thick film of glass is also formed on the mounting and non-mounting surfaces of the ceramic substrate 4 to cover and protect the thick-film conductors 5, bonding electrodes 6, thick-film conductors 7 formed on the non-mounting surface of the ceramic substrate 4, the thick-film resistors 9 formed connected to the thick-film conductor 7, and other components.

To check the continuity between the thick-film conductors 5 and 7 connected via the through-holes 3, openings 11a and 11b are formed to prevent formation of the protective glass film 10 and thus expose the corresponding parts of the thick-film conductors 5 and 7.

A dike 12 formed from a wall of the thick-film deposited during a process forming a thick-film on the ceramic substrate 4 is also formed to surround the mounting surface-side opening of the pressure conveyance through-hole 2 in the ceramic substrate 4.

A sensor unit 17 is formed by bonding a pressure sensor chip 16 to a large rectangular plate glass pedestal 14 having in the center thereof a pressure conveyance through-hole 13. The pressure sensor chip 16 comprises a thin-wall diaphragm 15 in the center thereof. This sensor unit 17 is mounted on the mounting surface side of the ceramic substrate 4 outside the dike 12 by die bonding using a printed or coated silicon-base die bond agent 19, positioning the sensor unit 17 to the ceramic substrate 4 such that the pressure conveyance through-hole 2 in the ceramic substrate 4 is aligned with the pressure conveyance through-hole 13 in the pedestal 14, thus forming pressure conveyance hole 18. Note that the side of the pressure sensor chip 16 from which material was removed to form the thin-wall diaphragm 15 is bonded to the pedestal 14 so that the center area of the diaphragm 15 is positioned over the pressure conveyance hole 18.

The pressure sensor chip 16 is, in this example, an n single crystal silicon, and four resistances (piezoresistances) are formed on the surface of the diaphragm 15 (i.e., the surface of the pressure sensor chip 16) by thermal diffusing or ion injecting boron or other p impurity to use the piezoresistance effect. The piezoresistances are wired to form a bridge circuit by means of s vapor-deposition aluminum wiring or diffusion wiring formed by introducing a high concentration p impurity. This construction concentrates stress on the piezoresistances.

Note that the bonding electrodes 6 are arrayed parallel on opposing sides of the sensor unit 17, and are connected to the corresponding electrodes (not shown in the Figures) of the pressure sensor chip 16 by means of bonding wires 20.

Dikes 21 are also formed from the walls of the thick-film deposited during a process forming a thick-film on the ceramic substrate 4 between the bonding electrodes 6 and the sensor unit 17 bonded to the mounting surface of the ceramic substrate 4.

To protect the sensor unit 17 and thick-films formed on the mounting surface of the ceramic substrate 4, the mounting surface of the ceramic substrate 4 on which the thick-films and sensor unit 17 are provided is covered by a resin cap 23.

This cap 23 has a large pan-like shape with a projection 22 providing for a pressure conveyance opening formed on the outside surface of the bottom of the pan. The cap 23 is bonded at a predetermined position on the mounting surface side of the ceramic substrate 4 using a silicon-base resin adhesive 24. The cap 23 further comprises a pressure conveyance hole 25 formed through the projection 22 on the bottom of the pan. Pressure can thus pass through both the pressure conveyance hole 25 and pressure conveyance hole 18 to act on the diaphragm 15 of the pressure sensor chip 16.

The through-holes 3 and openings 11a formed in the thick-film conductor 5 are disposed to the positions at which the cap 23 is bonded to the mounting surface side of the ceramic substrate 4. When the cap 23 is bonded to the mounting surface of the ceramic substrate 4, the openings 11a in the thick-film conductor 5 are covered by the adhesive 24, and the openings of the through-holes 3 in the mounting surface side of the ceramic substrate 4 are closed by the cap 23 and adhesive 24. It is therefore possible that the through-holes 3 and openings 11a may not be completely covered due to error in the bonding position of the cap 23. As a result, it is necessary to precisely bond the cap 23 to the specified position on the mounting surface side of the ceramic substrate 4.

This can be accomplished by providing positioning marks 26 indicating the bonding position of the cap 23 on the mounting surface side of the ceramic substrate 4, and bonding the cap 23 to the positioning marks 26. The positioning marks 26 are also formed from a thick-film conductor formed in a process forming one of the thick-films on the ceramic substrate 4. A dike 27 formed from a wall of the thick-film deposited during a process forming a thick-film on the ceramic substrate 4 is also formed around the inside wall of the cap 23 bonded at a specific position on the mounting surface side of the ceramic substrate 4.

The semiconductor pressure sensor 1 of the preferred embodiment is thus comprised as described above.

It should be noted that the openings 11a and 11b form the exposed conductors with the openings 11a specifically forming the exposed conductors on the mounting surface. The dikes 12 and 21 form the first and second dikes, respectively. Furthermore, because the Au used to form the bonding electrodes 6 does not induce migration, migration does not occur between the openings 28 used to expose a specific part of the bonding electrodes 6 by preventing formation of the protective glass film 10. Migration in the openings 11b formed in the thick-film conductor 7 on the non-mounting surface of the ceramic substrate 4 can also be prevented by a resin coating applied after the semiconductor pressure sensor 1 is completed.

Figure 3A:
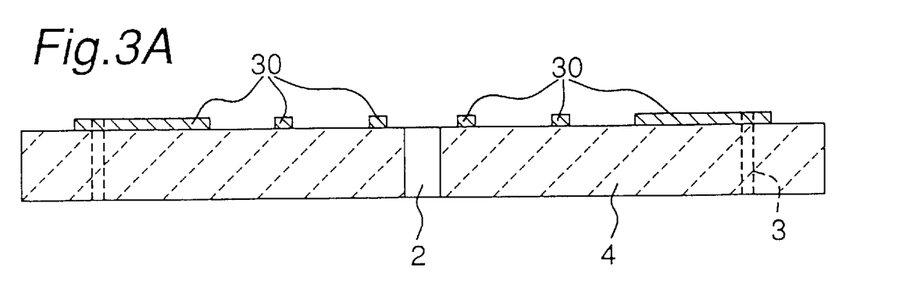
FIGS. 3A, 3B, 3C and 3D are cross section diagrams for showing the manufacturing process forming a thick-film on the ceramic substrate 4 shown in FIGS. 1 and 2.
Figure 3B:
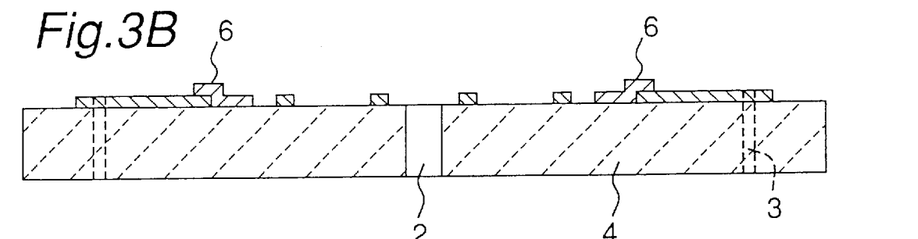
Figure 3C:
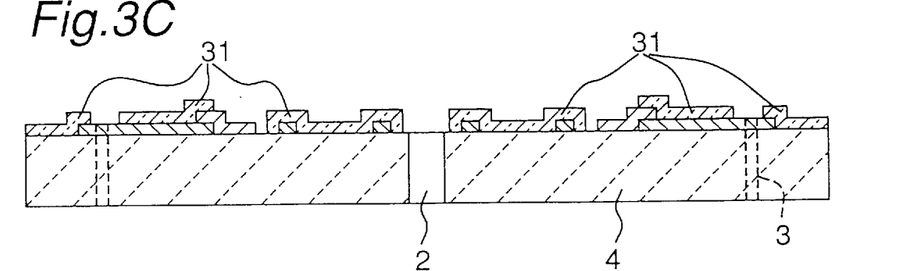
Figure 3D:
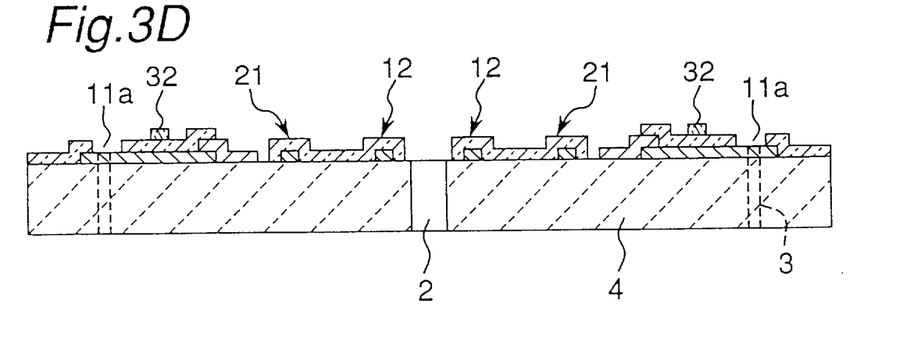
Figure 4:
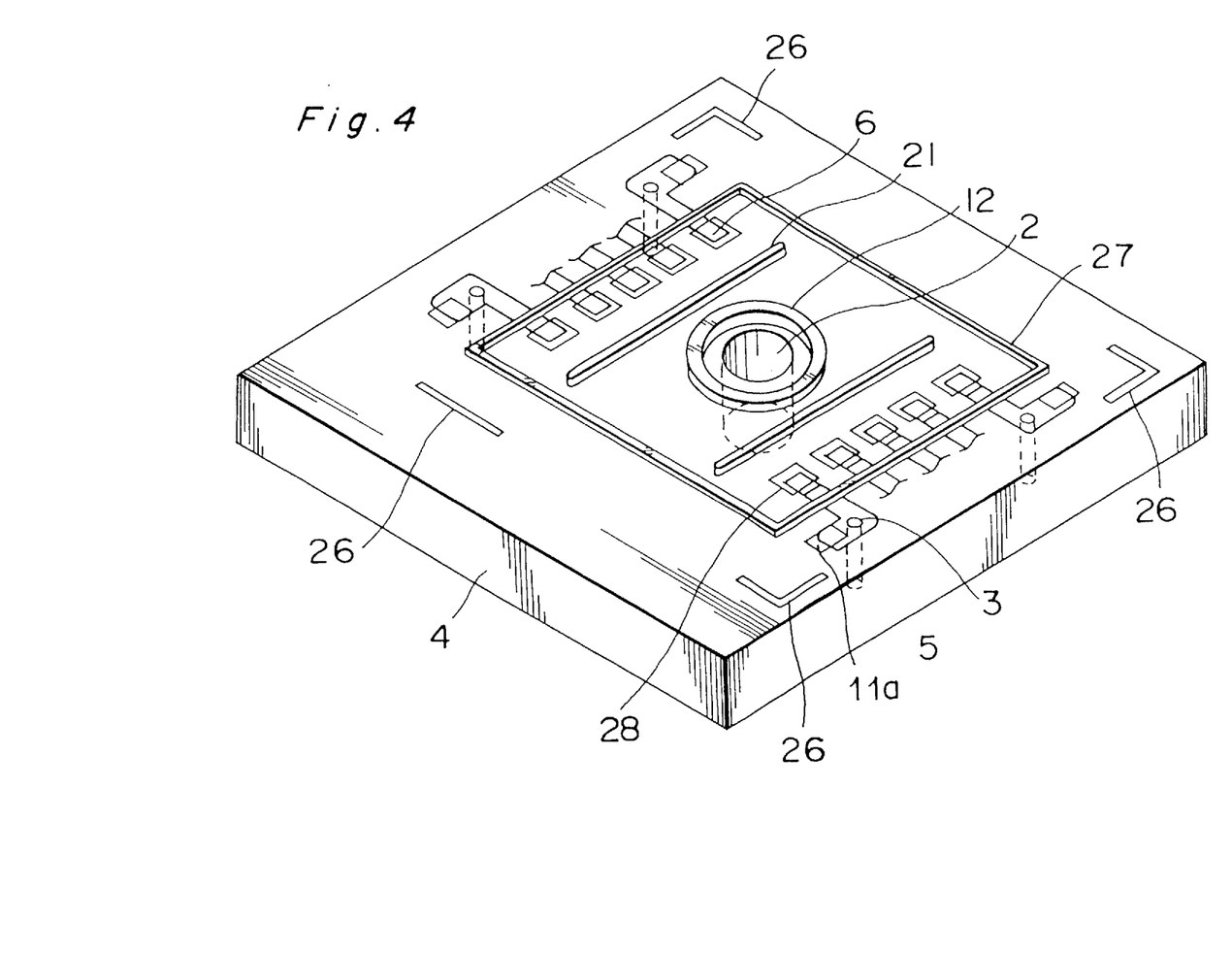
FIG. 4 is an overview of the ceramic substrate 4 following the manufacturing process shown in FIG. 3.

FIGS. 3A–3D are cross section diagrams used to describe the manufacturing process forming a thick-film on the ceramic substrate 4 shown in FIGS. 1 and 2, and FIG. 4 is an overview of the ceramic substrate 4 following the manufacturing process shown in FIGS. 3A–3D. The process whereby a thick-film s formed on the ceramic substrate 4 is described below with reference to FIGS. 3A–3D.

First, as shown in FIG. 3A, a thick-film paste of, for example, Ag-Pd or Ag-Pt is printed in a specific pattern on the mounting surface of the ceramic substrate 4 wherein the pressure conveyance through-hole 2 and through-holes 3 were previously formed in a die mold process. The printed thick-film pattern is then dried, and baked to form the first thick-film layer 30, a thick-film conductor.

Next, as shown in FIG. 3B, a thick-film paste of Au forming the bonding electrodes 6 is similarly printed in a specific pattern on the ceramic substrate 4, dried, and baked to form the bonding electrodes 6.

As shown in FIG. 3C, a thick-film paste of insulated glass forming a second thick-film layer 31 is then printed in a specific pattern and dried, and as shown in FIG. 3D a thick-film paste of insulated glass forming a third thick-film layer 32 is then printed in a specific pattern and dried. The ceramic substrate 4 is then baked to form the second and third thick-film layers 31 and 32, resulting in a ceramic substrate 4 as shown in FIG. 4.

The thick-film conductors 5 and positioning marks 26 are thus formed from the first thick-film layer 30, and the protective glass film 10 is formed from the second thick-film layer 31. The dikes 12 and 21 are formed by building the second thick-film layer 31 up on the first thick-film layer 30, and the third dike 27 is formed by building the second thick-film layer 31 up on the first thick-film layer 30, and then building the third thick-film layer 32 over the second thick-film layer 31. It should be noted that while the first two dikes 12 and 21 are formed from two layers (the first and second thick-film layers 30 and 31), and the third dike 27 is formed from three thick-film layers (the first, second, and third thick-film layers 30, 31, and 32), the present invention shall not be so limited, and the height of the dikes can be increased by forming additional thick-film layers.

After completing the above processes, a process forming the conductor on the walls of the through-holes 3 is accomplished, and processes forming the thick-film conductors 7, thick-film resistors 9, and protective glass film 10 on the non-mounting surface of the ceramic substrate 4 are accomplished.

Figure 5A:
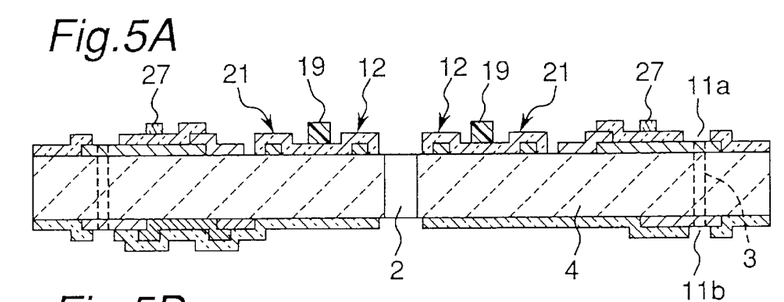
FIGS. 5A, 5B, 5C and 5D are cross section diagrams for showing the process executed after the process shown in FIG. 3.
Figure 5B:
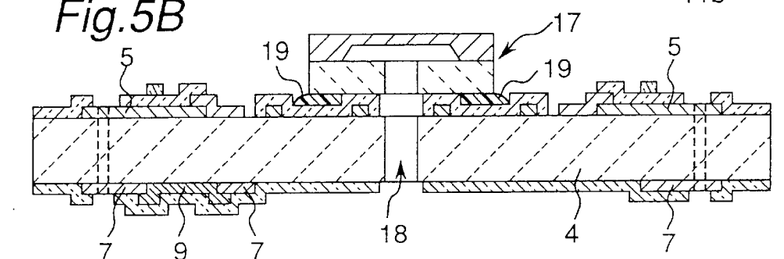
Figure 5C:
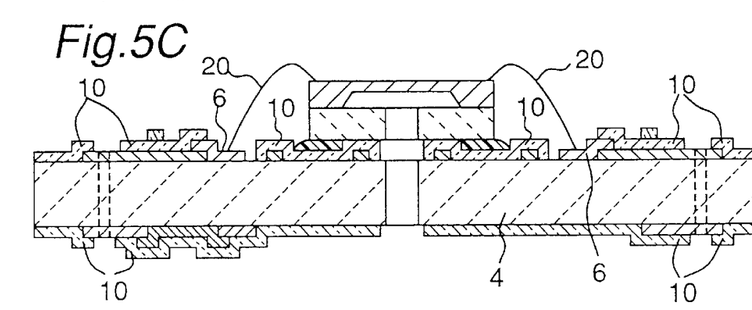
Figure 5D:
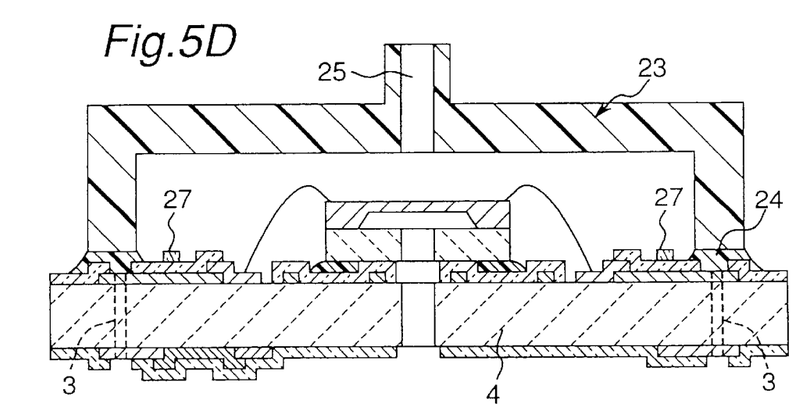
Figure 6:
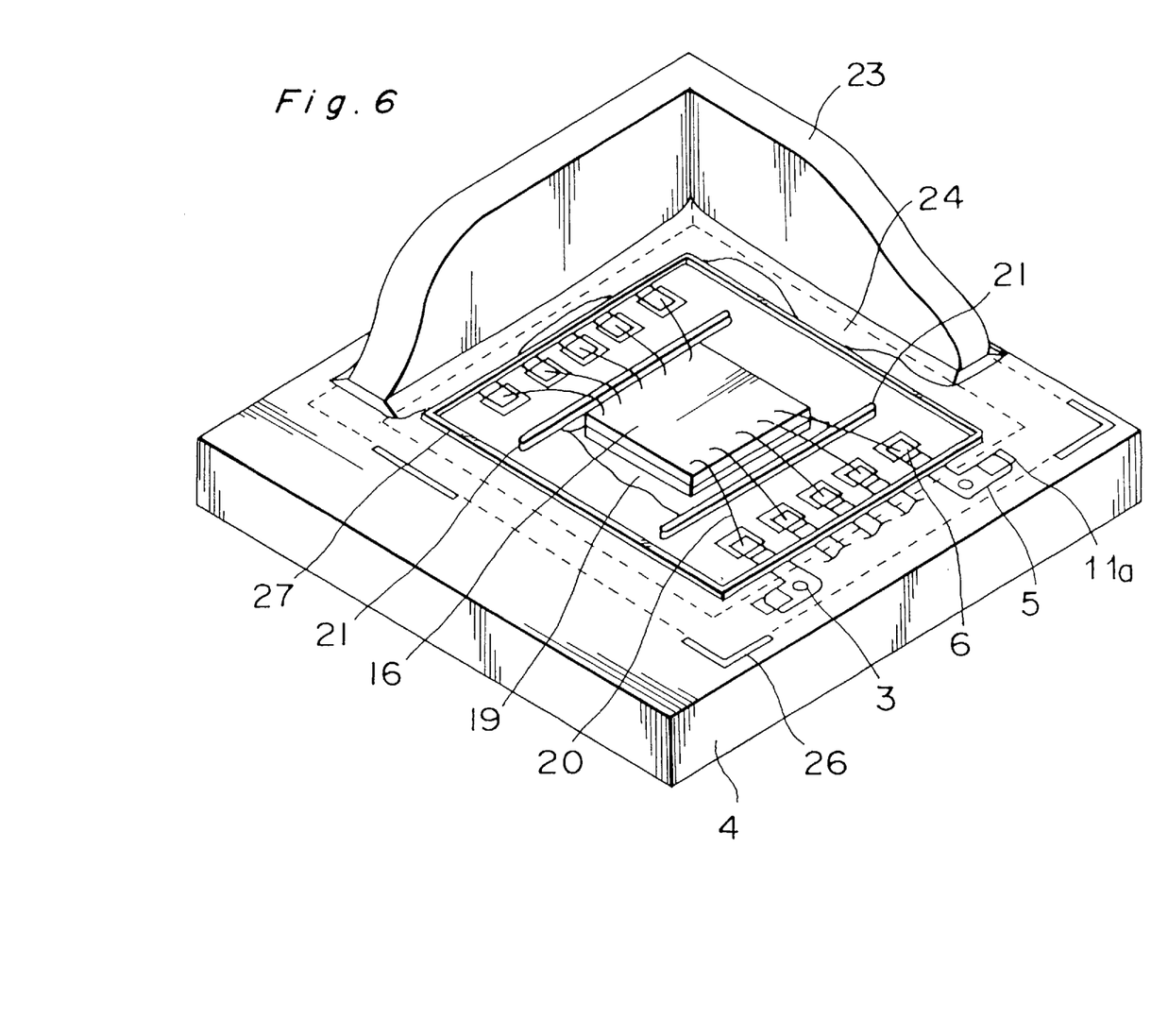
FIG. 6 is an overview of the semiconductor pressure sensor following the manufacturing process shown in FIG. 5.

FIGS. 5A–5D are cross section diagrams used to describe the process executed after the process shown in FIGS. 3A–3D to manufacture the semiconductor pressure sensor 1, and FIG. 6 is an overview of the semiconductor pressure sensor 1 following the manufacturing process shown in FIGS. 5A–5D. The process for mounting the sensor unit 17 and cap 23 on the mounting surface of the ceramic substrate 4 is described next below with reference to FIGS. 5A–5D.

First, as shown in Fig. 5A, the die bond agent 19 is printed or coated in the die bond area at a specific position on the outside of the dike 12. The die bond agent 19 is not printed or applied outside each of the other dikes 21 at this time.

Next, as shown in FIG. 5B, the pedestal 14 of the sensor unit 17 is positioned on the die bond agent 19 at the same specific position so that the pressure conveyance through-hole 2 in the ceramic substrate 4 and the pressure conveyance through-hole 13 in the pedestal 14 are aligned to form a pressure conveyance hole 18. The die bond agent 19 is then cured. While curing, the viscosity of the die bond agent 19 will first drop before the die bond agent 19 hardens, and can flow easily out from the die bond area when the viscosity is low. The dike 12, however, prevents the low viscosity die bond agent 19 from flowing into the pressure conveyance hole 18, and the other dike 21 prevents the low viscosity die bond agent 19 from flowing over the bonding electrodes 6.

The electrodes (not shown in the Figures) of the pressure sensor chip 16 and the bonding electrodes 6 are then connected with bonding wires 20 as shown in FIG. 5C. The adhesive 24 is then applied to the adhesion surface of the cap 23 to be bonded to the ceramic substrate 4 as shown in FIG. 5D, the cap 23 is positioned according to the positioning marks 26, and the adhesive 24 is cured to complete the semiconductor pressure sensor 1 as shown in FIG. 6. Note that, like the die bond agent 19, the adhesive 24 can flow during curing.

The third dike 27 prevents the low viscosity adhesive 24 from flowing over the bonding electrodes 6, prevents exposing the openings 11a formed in the thick-film conductor 5, and prevents the openings of the through-holes 3 from being exposed. Note, also, that while the adhesive 24 is applied to the adhesion surface of the cap 23, the adhesive 24 may be alternatively applied to the cap adhesion area, i.e., the specific area on the mounting surface of the ceramic substrate 4 to which the cap 23 is attached. Furthermore, while there is an additional process for soldering the lead terminals 8 separately from the processes shown in FIGS. 3 and 5, description of this soldering process is omitted herein.

With a semiconductor pressure sensor according to the preferred embodiment of the present invention as thus described, the openings of each through-hole 3 can be strongly and reliably closed by bonding a cap 23 to the cap adhesion area with adhesive 24 because the through-holes 3 and the openings 11a in the thick-film conductor 5 are provided within the cap adhesion area. Pressure introduced to the semiconductor pressure sensor through the pressure conveyance hole 25 can thus be prevented from leaking, and can therefore be accurately detected by the pressure sensor chip 16. Moreover, the openings 11a formed in the thick-film conductor 5 can be positively enveloped to prevent migration between the openings 11a.

It should also be noted that the cap 23 must be reliably bonded to a precise position in order to close the openings to the through-holes 3 and cover the openings 11a formed in the thick-film conductor 5. This can be accomplished easily and accurately by positioning and bonding the cap 23 to the positioning marks 26. It should be noted, however, that it is not necessary to envelope the openings 11b formed on non-mounting surface side of the ceramic substrate 4 during the processes manufacturing the semiconductor pressure sensor 1 because a process preventing migration by applying a resin or other coating can be accomplished after the semiconductor pressure sensor 1 is finished, e.g., during the process mounting the semiconductor pressure sensor 1 to the substrate. Furthermore, it is not necessary to cover the openings 28 in the bonding electrodes 6 because the bonding electrodes 6 are made from gold, a material known to be resistant to ion migration.

As also described above, a dike 12 is provided surrounding the circumference of the opening on the mounting surface side of the pressure conveyance through-hole 2 forming the pressure conveyance hole 18; another dike 21 is provided between the sensor unit 17 and the parallel bonding electrodes 6 arrayed on opposing sides of the sensor unit 17; and a third dike 27 is provided along the inside wall of the cap 23. The first dike 12 is able to prevent the die bond agent 19 bonding the sensor unit 17 from flowing out and occluding the pressure conveyance hole 18 while the die bond agent 19 cures. The second dike 21 is likewise able to prevent the die bond agent 19 from flowing during curing and contaminating the bonding electrodes 6, and by thus preventing contamination is able to eliminate the problem of poor connections being formed between the bonding electrodes 6 and the bonding wires 20 bonded thereto.

Similarly, the third dike 27 prevents the adhesive 24 bonding the cap 23 from flowing out and contaminating the bonding electrodes 6 while curing. It is therefore possible to eliminate the problem of poor connections being formed between the bonding electrodes 6 and the bonding wires 20 bonded thereto as a result of contamination, to prevent exposing the openings 11a formed in the thick-film conductor 5 on the mounting surface, and to prevent opening the openings to the through-holes 3.

The dikes 12 and 21 and the positioning marks 26 can also be formed at the same time and during the same process used to form the thick-film conductor 5 and protective glass film 10 on the ceramic substrate 4. It is therefore possible to form the dikes 12 and 21 and positioning marks 26 precisely positioned and at the nominal cost of the additional materials without providing a separate process specifically for forming the dikes 12 and 21 and positioning marks 26. The third dike 27 can also be formed by simply adding a process for printing and drying a thick-film of insulated glass, and can therefore be formed at a relatively low cost, including the nominal materials cost.

It is therefore possible to reduce manufacturing defects and improve reliability in a semiconductor sensor formed with a thick-film hybrid IC using through-holes while incurring only a low, nominal materials cost.

It should be noted that while the two dikes 12 and 21 are formed with two thick-film layers and the third dike 27 is formed with three thick-film layers in the preferred embodiment described above, the invention shall not be so limited. While the effectiveness of the three dikes 12, 21, and 27 can be increased by increasing the thickness of the thick-film or increasing the number of layers, the number of thick-film layers forming the dikes 12, 21, and 27 is determined by the number of thick-film layers formed on the semiconductor sensor due to the need to form said dikes at a low cost.

The positioning marks 26 are also formed from a single thick-film conductor covered by a protective glass film as described above. The height of the positioning marks 26 can likewise be increased by increasing the thickness of the thick-film or increasing the number of layers so that the positioning marks 26 can be used as positioning guides for the cap rather than simply as positioning marks. As with the above dikes, however, the height of the positioning marks 26 is determined by the number of thick-film layers formed on the semiconductor sensor due to the need to form said positioning marks at a low cost.

Furthermore, the bonding electrodes 6 are described as being formed from a Au thick-film in the preferred embodiment above, but the present invention shall not be so limited. Specifically, the bonding electrodes 6 can be formed from a thick-film of any conductor material resistant to migration that can be electrically connected by means of wire bonding with bonding wires 20.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor sensor comprising:

a substrate having a mounting side, a non-mounting side, and through-holes pierced through said substrate to connect said mounting and non-mounting sides;

a semiconductor sensor chip with a pedestal mounted on a mounting surface of said substrate mounting side with die bond agent;

a pan-shaped cap bonded by an adhesive to said mounting surface to cover said semiconductor sensor chip;

thick-film conductors connected to each other by conductors formed on the walls of said through-holes and formed in a specific pattern on both sides of said substrate;

bonding electrodes connected to said thick-film conductors of the mounting side of said substrate, and connected to said semiconductor sensor chip by wire bonding; and a protective glass film forming a protective layer directly over said through-holes and portions of said thick-film conductors, other portions of said thick-film conductors remaining uncovered by said protective glass film thus forming exposed conductors;

wherein the through-holes and exposed conductors formed on the mounting side are disposed at the position to which the cap is bonded to the substrate, and the through-hole openings on the mounting side are each directly covered by and in contact with a protective composite formed of a portion of said protective glass film and the adhesive directly covering the portion of said protective glass film, and the exposed conductors on the mounting side are directly in contact with and covered by the adhesive.

2. A semiconductor sensor for detecting a pressure applied thereto comprising:

a substrate having a mounting side, a non-mounting side, and through-holes pierced through said substrate to connect said mounting and non-mounting sides;

a semiconductor sensor chip having a diaphragm formed in the center thereof;

a pan-shaped cap bonded on said substrate by an adhesive to cover said sensor chip, said sensor chip being supported with a pedestal bonded on a mounting surface of said substrate mounting side with a die bond agent, the pressure being applied to said diaphragm through a pressure conveyance hole of said substrate and a pressure conveyance hole formed through said pedestal;

thick-film conductors connected to each other by conductors formed on the walls of the through-holes and formed in a specific pattern on both the mounting and non-mounting sides of the substrate;

bonding electrodes connected to said thick-film conductors of the mounting side of the substrate, and connected to the semiconductor sensor chip by wire bonding; and a protective glass film forming a protective layer directly over said through-hole openings and portions of said thick-film conductors, other portions of said thick-film conductors remaining uncovered by said protective glass film thus forming exposed conductors;

wherein the through-hole openings on the mounting side and the exposed conductors on the mounting side are disposed at the position to which the cap is bonded to the substrate so that each through-hole opening on the mounting side is directly covered by and in contact with a protective composite formed of a portion of said protective glass film and the adhesive covering the portion of said protective glass film, and said exposed conductors are directly in contact with and covered by the adhesive.

3. The semiconductor sensor according to claim 2 further comprising:

a first dike formed on the mounting side as a wall of at least one thick-film layer to encircle the outside circumference of said pressure conveying hole of said substrate, said first dike preventing the die bond agent from flowing into the pressure conveying holes in the pedestal and the substrate.

4. The semiconductor sensor according to claim 3 further comprising:

a second dike formed as a wall of at least one thick-film layer between said pedestal and the bonding electrodes, said second dike preventing the die bond agent from flowing over the bonding electrodes.

5. The semiconductor sensor according to claim 2 further comprising positioning marks on the mounting side of the substrate indicating the position to which the cap is to be bonded to the substrate.

6. The semiconductor sensor according to claim 5, wherein the positioning marks are formed from a thick-film conductor.

7. A semiconductor sensor comprising:

a substrate having a mounting side, a non-mounting side, and through-holes connecting said mounting and non-mounting sides;

a sensor unit adhered to said mounting side with a bonding agent;

a protective cap adhered to said mounting side with an adhesive, said protective cap covering and forming a boundary around said sensor unit at the location where said cap is adhered to said mounting side, the boundary of said protective cap being positioned over said through-holes such that said through holes are beneath said adhesive;

a plurality of thick-film conductors formed on respective surfaces of said mounting and non-mounting sides to form a specific pattern;

bonding electrodes located on said mounting side, said bonding electrodes connected to said sensor unit and said thick-film conductors located on said mounting side surface;

a glass film forming a protective layer over said through-holes and portions of said thick-film conductors, other portions of said thick-film conductors remaining uncovered by said glass film, the uncovered portions of said thick-film conductors on said mounting side being positioned under the boundary of said protective cap such that these uncovered portions are directly in contact with and covered by said adhesive, wherein said through-holes are directly covered by and in contact with a protective composite formed of a portion of said glass film and said adhesive directly covering the portion of said glass film.

8. A semiconductor sensor according to claim 7 wherein said substrate includes a pressure conveying through-hole aligned with said sensor unit.

9. A semiconductor sensor according to claim 8, further comprising:

a dike forming a barrier around said pressure conveying through-hole, said dike preventing the bonding agent used to adhere said sensor unit to said mounting side from leaking into said pressure conveying through-hole.

10. A semiconductor sensor according to claim 7, further comprising:

a dike forming a barrier between said bonding electrodes and said sensor unit, said dike preventing the bonding agent used to adhere said sensor unit to said mounting side from leaking onto said bonding electrodes.

11. A semiconductor sensor according to claim 7, further comprising:

a dike forming a barrier between said bonding electrodes and said protective cap, said dike preventing the adhesive used to adhere said protective cap to said mounting side from leaking onto said bonding electrodes.

* * * * *